US005130890A

United States Patent [19]

Nhu

[11] Patent Number: 5,130,890

[45] Date of Patent: Jul. 14, 1992

[54] CABLE CONNECTOR/ADAPTER SUPPORT FOR MULTI-TERMINAL DATA PROCESSORS

[75] Inventor: David H. Nhu, North Potomac, Md.

[73] Assignee: The United States of America as represented by the Secretary of the Navy, Washington, D.C.

[21] Appl. No.: 758,918

[22] Filed: Sep. 10, 1991

[51] Int. Cl.[5] ........................ H05K 5/02; H01R 13/60; A47B 97/00

[52] U.S. Cl. .................................... 361/390; 361/428; 439/528; 312/282; 312/321.5

[58] Field of Search ..................... 312/223, 282, 321.5, 312/330.1; 211/26; 248/288.3, 309.1, 316.7; 379/319, 320, 321, 327; 439/528; 361/334, 340, 390, 427, 428

[56] References Cited

U.S. PATENT DOCUMENTS 4,246,436 1/1981 Hoffman et al. ................ 361/427 X
4,921,444 5/1990 Cama ................................. 439/528

FOREIGN PATENT DOCUMENTS 2143425 2/1985 United Kingdom ................. 211/26
2215144 9/1989 United Kingdom ................ 439/528

*Primary Examiner*—Leo P. Picard
*Assistant Examiner*—Michael W. Phillips
*Attorney, Agent, or Firm*—Kenneth E. Walden; Jacob Shuster

[57] ABSTRACT

A support panel movably mounted on the cabinet of a multi-terminal data processor, carries retainers releasably holding cable connectors, disconnected from the processor terminals, in an orderly arrangement to protect the connectors from damage and facilitate proper plug in handling.

5 Claims, 4 Drawing Sheets

CABLE CONNECTOR/ADAPTER SUPPORT FOR MULTI-TERMINAL DATA PROCESSORS

BACKGROUND OF THE INVENTION

This invention relates generally to the handling of cable connectors or adapters plugged into or withdrawn from the access terminals of data processing hardware or computer assemblies.

Computerized equipment and data processing units have associated therewith many signal conducting cables connected or disconnected through access terminals during research programming and testing operations at various installations, including scientific laboratories or the like. Often, such cables with unplugged connectors and adapters at the ends thereof are left on the floor adjacent the computer equipment. The connectors and adapters are accordingly subject to damage and their cables become mixed up so as to increase the tendency for technicians to perform erroneous plug-in operations during reprogramming or testing of the computer equipment.

It is therefore an important object of the present invention to prevent damage and mix-up of cables as a result of operations involving withdrawal of cable connectors or adapters from multi-terminal types of data processing equipment.

SUMMARY OF THE INVENTION

In accordance with the present invention, the cabinet frame supporting data processing equipment or hardware exposes a plurality of access terminals in proximity to one or more displaceable support panels on which disconnected cable connectors or adapters may be held or stored in an orderly arrangement to facilitate subsequent plug-in operations.

According to certain embodiments of the invention, the support panel is hingedly connected to the cabinet frame for pivotal displacement about an axis parallel to a common plane with which the access terminals are aligned. The panel is thereby displaced to an operative position in angular relation to the terminal alignment plane exposing a plurality of retainer devices for reception and withdrawal of cable connectors. The cable connectors may thereby be held on the support panel in spaced relation to each other in a convenient arrangement with cables extending therefrom adjacent to the access terminals. The retainer devices according to one embodiment are in the form of angularly adjustable clamps carried on the panel to accommodate reception of standard, low-level serial or parallel connectors/adapters. According to other embodiments, the retainer devices are edge recesses or holes formed in the support panel to receive and hold connectors on the panel while in its operative position extending perpendicular to the terminal alignment plane. The support panel may be slidably displaced to its operative position from a retracted storage position within a top wall formation of the cabinet frame according to yet another embodiment of the invention.

BRIEF DESCRIPTION OF THE DRAWING FIGURES

Other objects, advantages and novel features of the invention will become apparent from the following detailed description of the invention when considered in conjunction with the accompanying drawing wherein.

DETAILED DESCRIPTION OF PREFERRED EMBODIMENT

Figure 1:
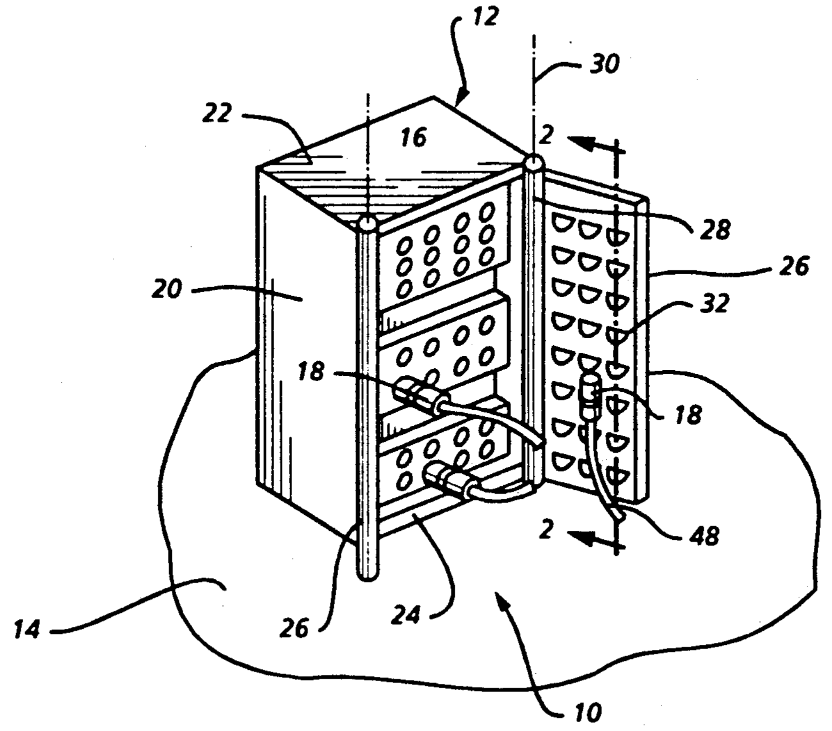
FIG. 1 is a perspective view of a typical signal data processing unit, structurally modified in accordance with one embodiment of the invention.

Referring now to the drawing in detail, FIG. 1 illustrates by way of example a signal data processing unit, generally referred to by reference numeral 10, having an outer cabinet frame 12 supported on a horizontal floor 14. the computer hardware enclosed in the cabinet frame 12 has a plurality of access terminals 16 into which standard cable connectors 18 are plugged. The access terminals are generally aligned in a vertical plane exposed at the rear of the cabinet frame between its side walls 20, top wall 22 and floor supported bottom wall 24.

In accordance with the present invention, a pair of rectangular, planar support panels 26 are mounted by vertical hinges 28 on the rear edges of the side walls 20 of the cabinet frame for pivotal displacement about vertical hinge axes 30 to operative positions as shown in FIG. 1, from retracted positions closing the rear end of the cabinet frame. In such operative positions of the panels 26, a plurality of retainer clamps 32 carried on the panels are exposed in an orderly arrangement for releasably holding disconnected cable connectors 18 in proximity to the access terminals 16 and in angular relation to the common plane of alignment of the terminals parallel to the hinge axes 30 at the rear exposure end of the cabinet frame. The retainer clamps 32 are at least equal in number to the number of cable connectors 18 adapted to be plugged in.

Figure 2:
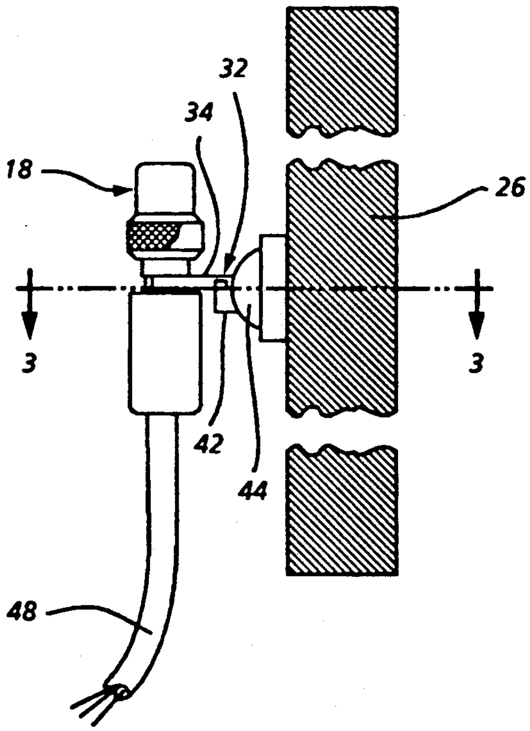
FIG. 2 is an enlarged partial section view taken substantially through a plane indicated by section line 2—2 in FIG. 1.
Figure 3:
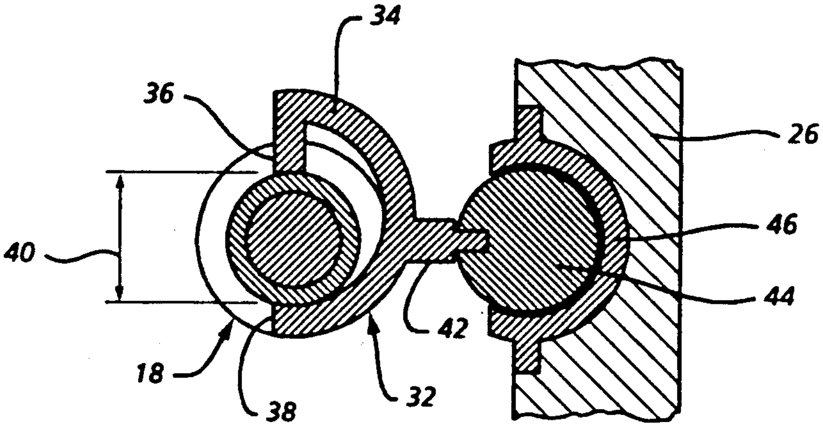
FIG. 3 is a section view taken substantially through a plane indicated by section line 3—3 in FIG. 2.

As shown in FIGS. 2 and 3, each clamp 32 is adapted to receive and releasably hold a standard, low-level type of serial connector 18 in angularly adjustable spaced relation to the panel 26, which is made of a rigid material. The clamp 32 includes a semi-circular, elastically deformable element 34 having a radially inwardly projecting end portion 36 spaced from the other end 38 to form a gap 40 through which the connector 18 is inserted and withdrawn from the clamp. A stem 42 projects rearwardly from the clamp element 34 into a spherical bearing 44 frictionally retained in an angularly adjusted position within a cage 46 embedded in and fixed to the panel 26 as more clearly seen in FIG. 3. Thus, the bearing 44 projects from the panel as shown to adjustably support the clamp element 34 through its stem 42 to accommodate retention of a connectors 18 and extension of its cable 48 therefrom. The cables 48 may be tagged for identification purposes.

It will be apparent from the foregoing description that cable connectors 18 plugged into the access terminals 16 may be withdrawn from terminals 16 and inserted into clamps 32 at corresponding locations on a panel 26 so as to avoid damage to such disconnected connectors as well as to facilitate correct subsequent, plug-in.

Figure 4:
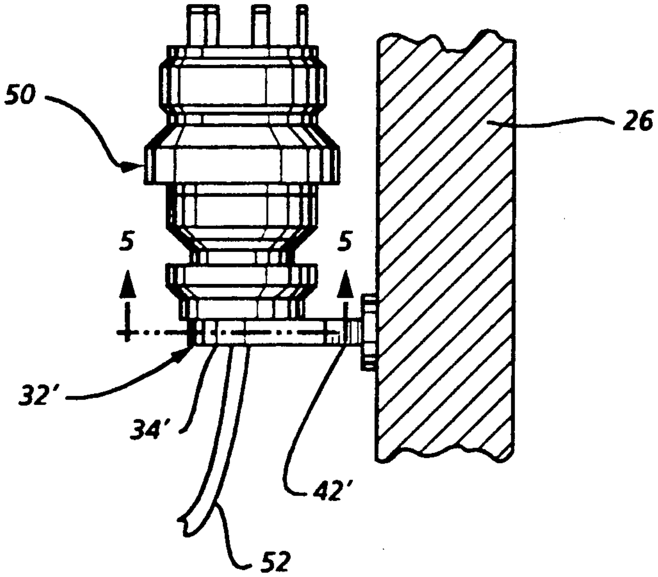
FIG. 4 is a side section view corresponding to FIG. 2, modified in accordance with another embodiment of the invention.
Figure 5:
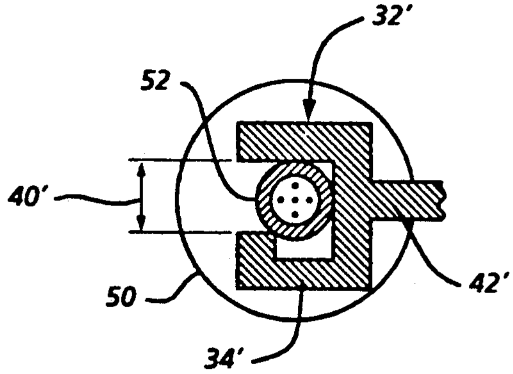
FIG. 5 is a section view taken substantially through a plane indicated by section line 5—5 in FIG. 4.

Other standard types of parallel connectors 50 with cables 52 as shown in FIGS. 4 and 5, may be held on the panel 26 by means of another form of clamp 32' having a rectangular shaped, elastically deformable clamp element 34' from which stem 42' projects into the panel. A smaller gap 40' is provided in the clamp element 34' to receive and hold the cable 52 with the bottom of the connector 50 in abutment therewith as more clearly seen in FIG. 4.

Figure 6:
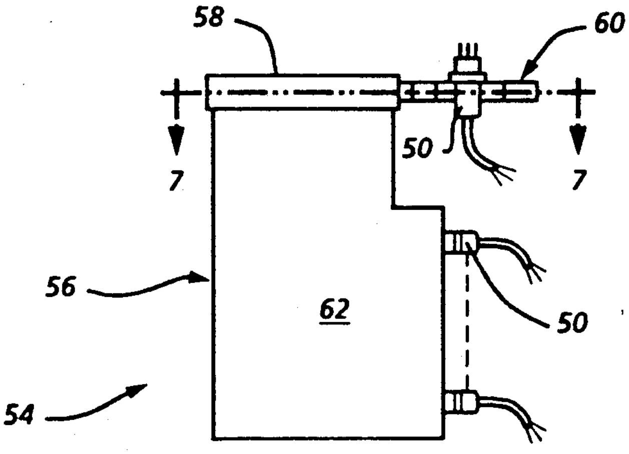
FIG. 6 is a side elevation view of a signal data processing unit, structurally modified in accordance with another embodiment, of the invention.
Figure 7:
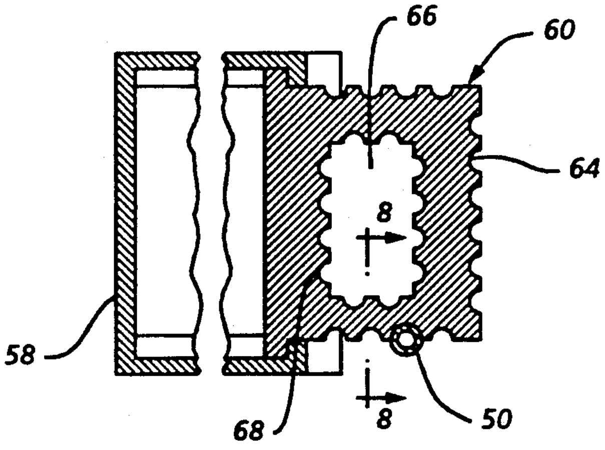
FIG. 7 is a partial top section view taken substantially through a plane indicated by section line 7—7 in FIG. 6.
Figure 8:
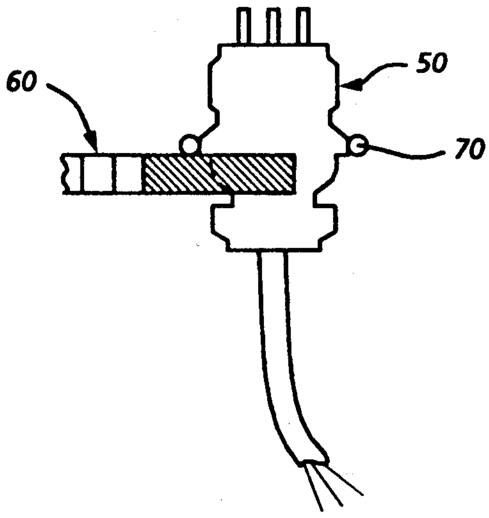
FIG. 8 is a section view taken substantially through a plane indicated by section line 8—8 in FIG. 7.

According to the embodiment shown in FIGS. 6, 7 and 8, a signal data processing unit 54 having a cabinet frame 56, is provided with a top wall storage formation 58 from which a rectangular support panel 60 is slidably withdrawn to an extended position. In such extended position, the panel 60 is exposed in a plane perpendicular to the alignment plane of the access terminals between the rear ends of the sidewalls 62 of the cabinet frame from which plugged in cable connectors 50 project. A plurality of such disconnected cable connectors 50 are adapted to be releasably retained in an orderly arrangement on the panel 60 to achieve the purposes of the present invention as hereinbefore explained.

The panel 60 as more clearly seen in FIG. 7 has outer peripheral edges within which retainer recesses 64 are formed. A rectangular opening 66 of greater dimension than the connectors 50 is formed within the panel 60. Retainer edge recesses 68 are also formed internally of the panel within opening 66 as shown. The edge recesses 64 and 68 are dimensioned to receive the connectors 50 having annular flange elements 70 for abutment with the top of the extended panel 60 to support the connectors as more clearly seen in FIG. 8.

Figure 9:
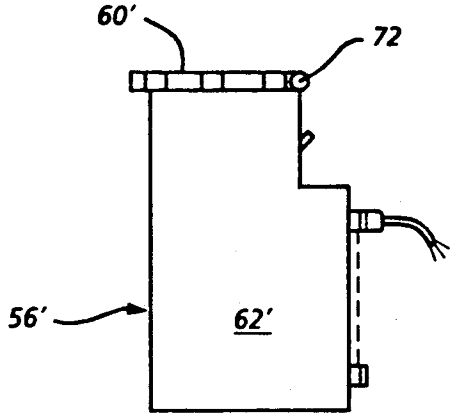
FIG. 9 is a side elevation view of a signal data processing unit modified in accordance with yet another embodiment of the invention.
Figure 10:
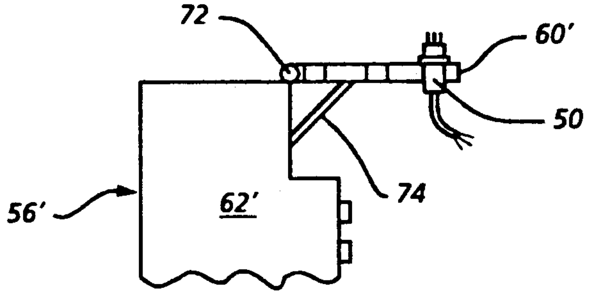
FIG. 10 is a partial side elevation view of the unit shown in FIG. 9, in a disconnected cable connector holding condition.

FIGS. 9 and 10 illustrate a modification of the panel mounting arrangement shown in FIGS. 6 and 7. A panel 60' with edge retainer recesses is attached to the top of a cabinet frame 56' by means of a horizontal hinge 72 so that the panel 60' may rest in its retracted position on top of the cabinet frame as shown in FIG. 9. In the extended position of the panel 60', to which it is pivotally displaced perpendicular to the access terminal alignment plane as shown in FIG. 10, the panel is supported by bracket struts 74 extended from the side walls 62' of the cabinet frame. The connectors 50 are releasably retained on the panel 60' as hereinbefore described with respect to FIGS. 7 and 8.

Figure 11:
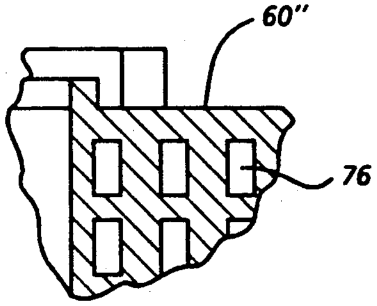
FIG. 11 is an enlarged, partial top section view corresponding to FIG. 7, but showing a modification thereof in accordance with a still further embodiment of the invention.

According to the embodiment shown in FIG. 11, a support panel 60", similar to that shown in FIG. 7, is provided with rectangular retainer holes 76 adapted to receive and releasably hold multi-pin D-type plugs or interfacing adapters through which signal data cables are adapted by be removably connected to the access terminals of the signal data processing unit.

Numerous other modifications and variations of the present invention are possible in light of the foregoing teachings. It is therefore to be understood that within the scope of the appended claims the invention may be practiced otherwise than as specifically described.

What is claimed is:

1. In combination with a cabinet enclosing data processing hardware having a plurality of access terminals adapted to receive cable connectors through which the hardware is programmed, means for holding said cable connectors in proximity to the access terminal while disconnected therefrom during reprogramming operations or the like, comprising: at least one supporting panel, means movably mounting said panel on the cabinet adjacent to said access terminals for displacement between retracted and extended positions and retainer means mounted on the panel for releasably supporting the cable connectors thereon in an orderly arrangement disconnected from the terminals while the panel is in the extended position, said retainer means comprising an opening formed in the panel dimensionally larger than each of the cable connectors and edge recesses formed externally on the panel and internally in said opening therein, within which the cable connectors are retained.

2. The combination of claim 1 wherein said means movably mounting the supporting panel includes a hinge connecting the panel to the cabinet.

3. The combination of claim 1 wherein said means movably mounting the supporting panel comprises a storage wall formation in the cabinet from which the panel is slidably withdrawable to the extended position.

4. The combination of claim 1 wherein said means movably mounting the supporting panel comprises a horizontal hinge connecting the panel to the cabinet, and bracket means for releasably retaining the panel in the extended position pivotally displaced from the retracted position.

5. In combination with data processing hardware having a plurality of access terminals adapted to receive cable connectors and frame means supporting the hardware with the access terminals thereof in alignment with a common plane, means for protectively holding said cable connectors in proximity to said access terminals while disconnected therefrom, comprising: a planar support panel, means movably mounting the panel on the frame means for displacement to an operative position adjacent to said access terminals at an angle to the common plane and retainer means mounted on the panel for releasably supporting the cable connectors thereon in spaced relation to each other while the panel is in the operative position thereof, including a plurality of clamp devices, each of said clamp devices including an elastically deformable element having a connector receiving gap, a stem connected to the element and displaceable means mounting the stem in the panel for angular adjustment of the element relative thereto.

* * * * *